United States Patent
Rizzolo et al.

(10) Patent No.: US 10,672,611 B2
(45) Date of Patent: Jun. 2, 2020

(54) HARDMASK STRESS, GRAIN, AND STRUCTURE ENGINEERING FOR ADVANCED MEMORY APPLICATIONS

(71) Applicant: International Business Machines Corporation, Armonk, NY (US)

(72) Inventors: Michael Rizzolo, Delmar, NY (US); Ashim Dutta, Menands, NY (US); Oscar van der Straten, Guilderland Center, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/165,311

(22) Filed: Oct. 19, 2018

(65) Prior Publication Data
US 2020/0126791 A1 Apr. 23, 2020

(51) Int. Cl.
*H01L 21/033* (2006.01)
*H01L 43/12* (2006.01)
*H01L 43/02* (2006.01)

(52) U.S. Cl.
CPC ...... *H01L 21/0332* (2013.01); *H01L 21/0337* (2013.01); *H01L 43/12* (2013.01); *H01L 43/02* (2013.01)

(58) Field of Classification Search
CPC . H01L 21/0332; H01L 21/0337; H01L 43/12; H01L 43/02
See application file for complete search history.

(56) References Cited

U.S. PATENT DOCUMENTS

| 5,500,312 | A  | * | 3/1996  | Harriott | G03F 1/20 430/5 |
| 7,282,755 | B2 |   | 10/2007 | Pakala et al. | |
| 7,993,535 | B2 |   | 8/2011  | Jiang et al. | |
| 8,735,301 | B2 | * | 5/2014  | Chen | H01L 21/31138 438/637 |
| 9,000,545 | B2 |   | 4/2015  | Kajiyama | |
| 9,269,893 | B2 |   | 2/2016  | Lu et al. | |
| 9,548,444 | B2 |   | 1/2017  | Sandhu et al. | |
| 2008/0157403 | A1 | * | 7/2008 | Lee | H01L 21/32051 257/787 |

(Continued)

OTHER PUBLICATIONS

Mehmood et. al. "Electronic and optical properties of titanium nitride bulk and surfaces from first principles calculations" Journal of Applied Physics 118, 195302 (2015), 2015 AIP Publishing LLC (Year: 2015).*

(Continued)

*Primary Examiner* — Sitaramarao S Yechuri
(74) *Attorney, Agent, or Firm* — Vazken Alexanian; Ryan, Mason & Lewis, LLP

(57) ABSTRACT

A method for manufacturing a semiconductor device includes forming one or more memory device layers over a contact structure. In the method, a plurality of hardmask layers are deposited on the one or more memory device layers in a stacked configuration. Alternating hardmask layers of the stacked configuration are different from each other in at least one respect. The method further includes patterning the plurality of hardmask layers and the one or more memory device layers into a pillar over the contact structure.

12 Claims, 9 Drawing Sheets

(56) References Cited

U.S. PATENT DOCUMENTS

| | | |
|---|---|---|
| 2008/0233730 A1* | 9/2008 | Yu .................... H01L 21/28123 438/596 |
| 2009/0209050 A1 | 8/2009 | Wang et al. |
| 2011/0155692 A1* | 6/2011 | Yau .................. H01L 21/31144 216/41 |
| 2012/0187546 A1* | 7/2012 | Akinmade-Yusuff ........................ H01L 21/31144 257/622 |
| 2013/0119494 A1 | 5/2013 | Li et al. |
| 2013/0309858 A1* | 11/2013 | Good ................. H01L 21/0332 438/591 |
| 2013/0334630 A1 | 12/2013 | Kula et al. |
| 2014/0057089 A1* | 2/2014 | Koshy .................. C23C 28/042 428/216 |
| 2015/0188033 A1 | 7/2015 | Lamborn et al. |
| 2015/0357559 A1 | 12/2015 | Nagel et al. |
| 2017/0033283 A1 | 2/2017 | Pinarbasi et al. |
| 2017/0133587 A1* | 5/2017 | Petz ........................ C23C 16/36 |
| 2019/0288188 A1* | 9/2019 | Sonoda .................. H01L 43/08 |

OTHER PUBLICATIONS

N. Roschewsky et al., "Magnetic Tunnel Junction Performance Under Mechanical Strain," Applied Physics Letters, Jun. 2018, 4 pages, vol. 112, No. 23.

B.-W. Nam et al., "Investigation of Water Warpage Induced by Multi-Layer Films," Journal of Semiconductor Technology and Science, Feb. 2018, pp. 7-13, vol. 18, No. 1.

* cited by examiner

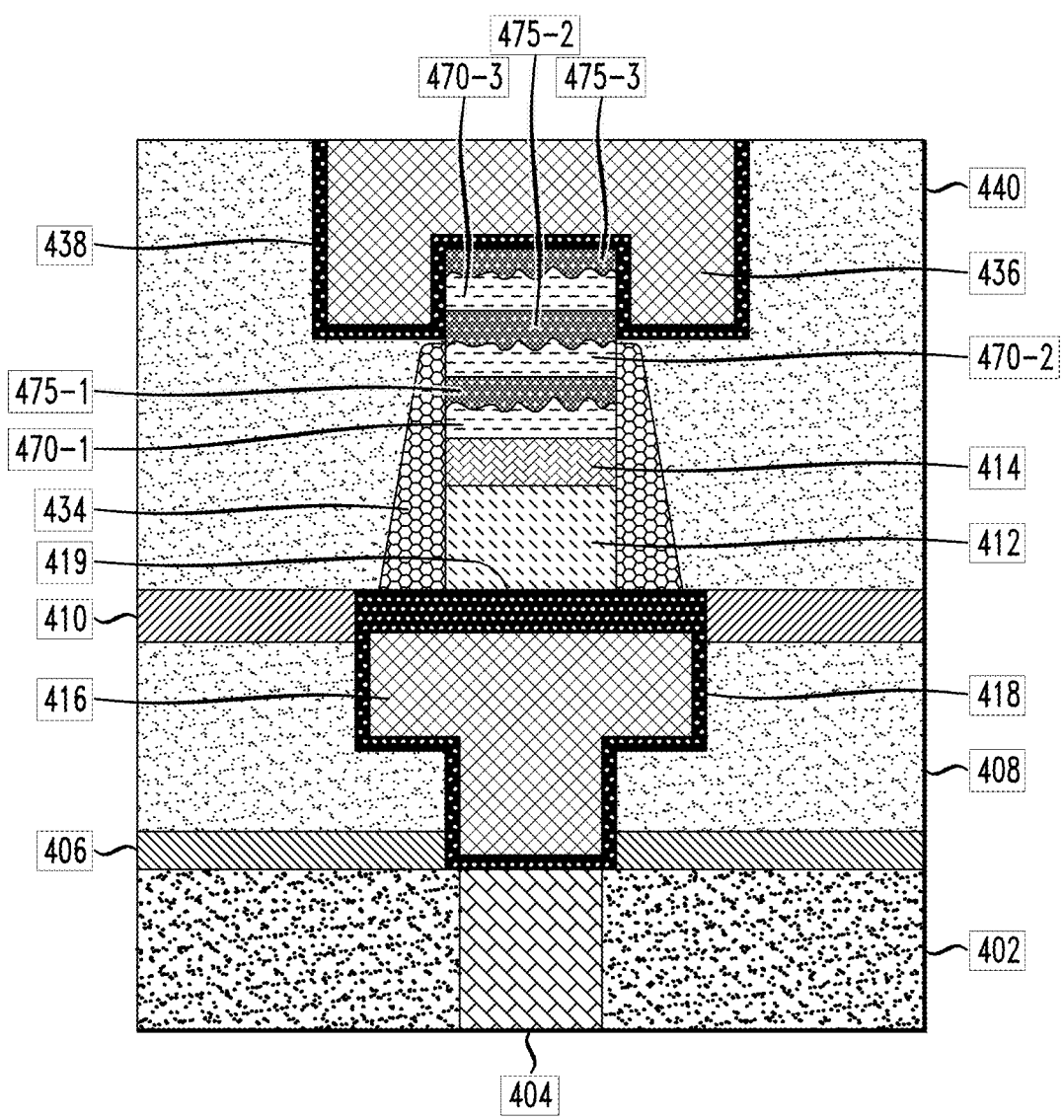

HARDMASK STRESS, GRAIN, AND STRUCTURE ENGINEERING FOR ADVANCED MEMORY APPLICATIONS

BACKGROUND

Certain integration schemes require memory elements in the back-end-of-line (BEOL) to span large vertical distances and be formed in a column or pillar shape. For example, such memory elements are included in phase-change random-access memory (PCRAM), resistive random-access memory (RRAM or ReRAM), and magnetic random-access memory (MRAM) devices. Formation of these memory element pillars requires increasing metal hardmask vertical distance (e.g., thickness) to, for example, greater than 50 nm. The increased hardmask thickness leads to very high film stress (e.g., >200 MPa) and large wafer bow (e.g., >100 μm). Large wafer bow, in turn, leads to poor alignment to underlying features.

Accordingly, there is a need for improved techniques for forming hardmasks for pillar memory elements in BEOL applications.

SUMMARY

According to an exemplary embodiment of the present invention, a method for manufacturing a semiconductor device includes forming one or more memory device layers over a contact structure. In the method, a plurality of hardmask layers are deposited on the one or more memory device layers in a stacked configuration. Alternating hardmask layers of the stacked configuration are different from each other in at least one respect. The method further includes patterning the plurality of hardmask layers and the one or more memory device layers into a pillar over the contact structure.

According to an exemplary embodiment of the present invention, a semiconductor device includes one or more memory device layers disposed over a bottom contact structure, and a plurality of hardmask layers disposed on the one or more memory device layers in a stacked configuration. Alternating hardmask layers of the stacked configuration are different from each other in at least one respect. The plurality of hardmask layers and the one or more memory device layers are in a pillar shape, and the plurality of hardmask layers are electrically conductive. The semiconductor device further includes a top contact structure disposed on the plurality of hardmask layers.

According to an exemplary embodiment of the present invention, a method for manufacturing a semiconductor device includes forming one or more memory device layers over a bottom contact structure, and depositing a plurality of hardmask layers on the one or more memory device layers in a stacked configuration. Alternating hardmask layers of the stacked configuration have opposite stress states from each other. In the method, the plurality of hardmask layers and the one or more memory device layers are patterned into a pillar over the bottom contact structure. A top contact structure is formed on the patterned plurality of hardmask layers.

According to an exemplary embodiment of the present invention, a method for manufacturing a semiconductor device includes forming one or more memory device layers over a bottom contact structure. In the method, a plurality of hardmask layers are deposited on the one or more memory device layers in a stacked configuration. Alternating hardmask layers of the stacked configuration include a buffer hardmask layer stacked on a large grain hardmask layer. The buffer hardmask layer blocks a crystal structure from the large grain hardmask layer from extending along a thickness direction of the stacked configuration. The method further includes patterning the plurality of hardmask layers and the one or more memory device layers into a pillar over the bottom contact structure. A top contact structure is formed on the patterned plurality of hardmask layers.

According to an exemplary embodiment of the present invention, a method for manufacturing a semiconductor device includes forming one or more memory device layers over a bottom contact structure. A lower hardmask layer is deposited on the one or more memory device layers, and an upper hardmask layer is deposited on the lower hardmask layer. The upper and lower hardmask layers have opposite stress states from each other, and the upper hardmask layer is thinner than the lower hardmask layer. The method further includes patterning the upper and lower hardmask layers and the one or more memory device layers into a pillar over the bottom contact structure. A top contact structure is formed on the patterned upper and lower hardmask layers.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which:

FIG. 9 is a schematic cross-sectional view illustrating a memory device including a multi-layer hardmask having alternating buffer layers with large/columnar grain layers having rough top surfaces, according to an embodiment of the invention.

DETAILED DESCRIPTION

Figure 1:
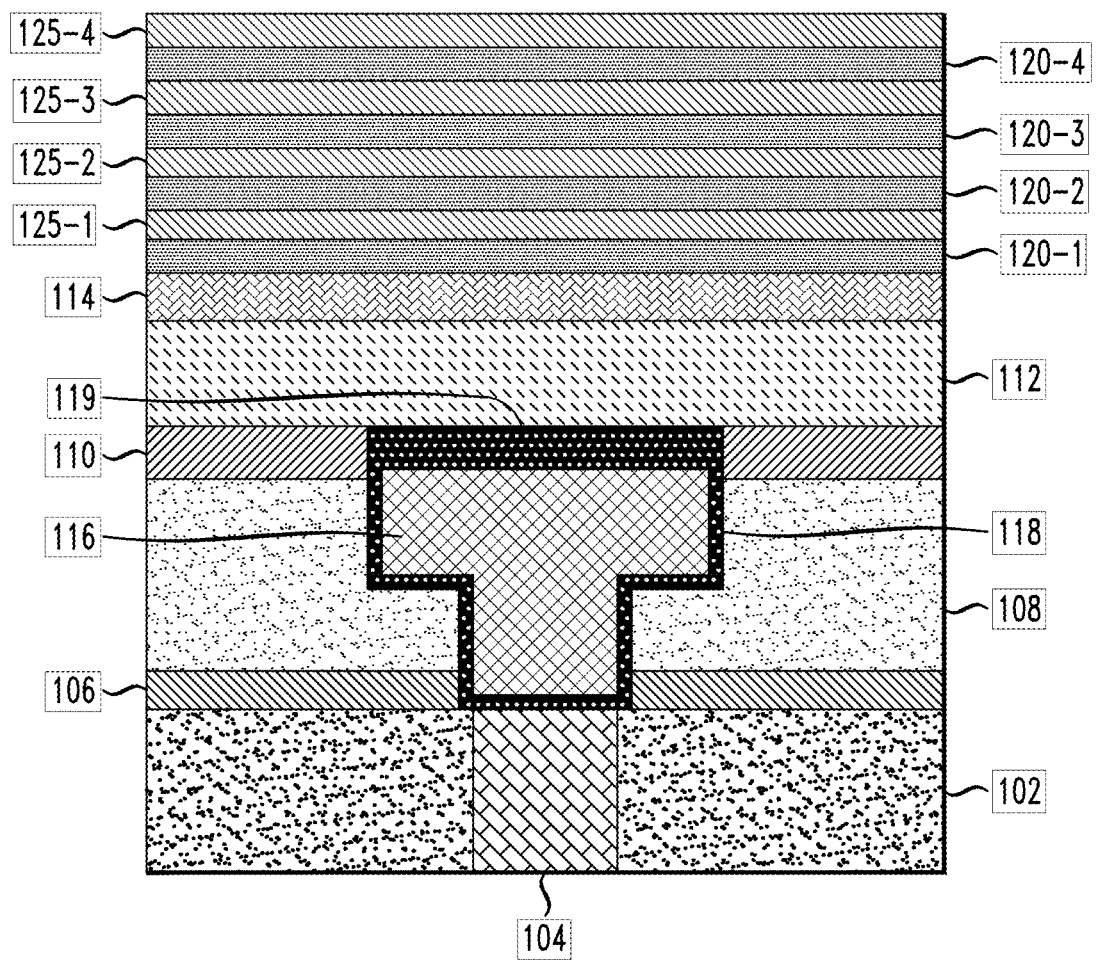
FIG. 1 is a schematic cross-sectional view illustrating manufacturing of a semiconductor device and showing multi-layer hardmask deposition using layers with different stress states, according to an embodiment of the invention.

Exemplary embodiments of the invention will now be discussed in further detail with regard to semiconductor devices and methods of manufacturing same and, in particular, to methods and structures for the reduction of high film stress and wafer bow caused by thick conductive hardmasks.

It is to be understood that the various layers and/or regions shown in the accompanying drawings are not drawn to scale, and that one or more layers and/or regions of a type commonly used in, for example, phase-change memory (PCM), phase-change random-access memory (PCRAM), resistive random-access memory (RRAM or ReRAM), three-dimensional (3D) RRAM, magnetic random-access memory (MRAM), fuse/anti-fuse, diode, ovonic threshold switch (OTS), bipolar junction transistor (BJT), complementary metal-oxide semiconductor (CMOS), field-effect transistor (FET), nanowire FET, nanosheet FET, fin field-effect transistor (FinFET), metal-oxide-semiconductor field-effect transistor (MOSFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, PCM, PCRAM, RRAM, 3D RRAM, MRAM, fuses/anti-fuses, diodes, OTSs, BJTs, FETs, CMOSs, MOSFETs, nanowire FETs, nanosheet FETs and/or FinFETs. By way of non-limiting example, the semiconductor devices can include, but are not limited to PCM, PCRAM, RRAM, 3D RRAM, MRAM, fuse/anti-fuse, diode, OTS, BJT, FET, CMOS, MOSFET, nanowire FET, nanosheet FET and FinFET devices, and/or semiconductor devices that use PCM, PCRAM, RRAM, 3D RRAM, MRAM, fuse/anti-fuse, diode, OTS, BJT, FET, CMOS, MOSFET, nanowire FET, nanosheet FET and/or FinFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. The term "thickness" may substitute for "height" and/or "depth" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element. The term "thickness" may substitute for "width" and/or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of a layer or substrate in the cross-sectional views or images, and "horizontal" refers to a direction parallel to the top surface of a layer or substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

As used herein, "compressive stress" or "compressively stressed" refers to a stress in inner lateral directions (e.g., pushing in inward directions) in a semiconductor layer.

As used herein, "tensile stress" or "tensile stressed" refers to a stress in outer lateral directions (e.g. pulling in outward directions) in a semiconductor layer.

In accordance with embodiments of the present invention, electrically conductive hardmasks for memory elements are comprised of multiple layers of metal material having different properties from each other. In general, the embodiments of the present invention are structured to reduce high film stress and wafer bow caused by thick conductive hardmasks. In one embodiment, a multi-layer metal hardmask is formed with each lamella (layer) having opposite stress states (e.g., alternating compressive and tensile stressed layers). In another embodiment, a multi-layer metal hardmask is formed to break up the propagation of a crystal structure along the entire thickness (e.g., vertical height) of the hardmask. More specifically, large/columnar grain layers are alternated with buffer layers to break up crystallinity. In one embodiment, the large/columnar grain layers may have rough top surfaces, and the buffer layers reduce the roughness by filling in gaps at the top surfaces of the large/columnar grain layers. In another embodiment, a thin, high stress top layer is formed on a lower layer of the hardmask. The top layer functions to reduce wafer bow and/or improve sidewall roughness to improve uniformity, and is completely or partially removed during patterning steps.

FIG. 1 is a schematic cross-sectional view illustrating manufacturing of a semiconductor device and showing multi-layer hardmask deposition using layers with different stress states, according to an embodiment of the invention. Referring to FIG. 1, a semiconductor device 100 includes a middle-of-line (MOL) or front-end-of-line (FEOL) interconnect 104 formed in a dielectric layer 102. The interconnect 104 may include, for example, a conductive via or contact electrically connecting to one or more devices, such as, for example, transistors, capacitors, and resistors.

The dielectric layer 102 includes, for example, tetraethyl orthosilicate (TEOS), silicon dioxide ($SiO_2$), carbon-doped silicon oxide (SiCOH), SiLK® dielectrics, and/or porous forms of these low-k dielectric films. As can be understood by one of ordinary skill in the art, the dielectric layer 102 can be on a semiconductor substrate (not shown), with intervening layers (e.g., lower conductive lines, devices, etc.) between the dielectric layer 102 and the substrate. A semiconductor substrate may comprise semiconductor material including, but not limited to, Si, SiGe, SiC, SiGeC or other like semiconductor. In addition, multiple layers of the semiconductor materials can be used as the semiconductor material of the substrate. A plurality of devices can be on the substrate, such as, for example, transistors, capacitors, and resistors.

The interconnect 104 includes, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides or combinations thereof.

A dielectric cap layer 106 comprising, for example, NBLoK™ material, is formed on the dielectric layer 102, and another dielectric layer 108 is formed on the dielectric cap layer 106. NBLoK™ material is from Applied Materials, Inc. of Santa Clara, Calif., and is a nitrogen-doped silicon carbide. The dielectric layer 108 includes the same or similar dielectric materials as the dielectric layer 102 such as, for example, TEOS, $SiO_2$, SiCOH, SiLK® dielectrics, and/or porous forms of these low-k dielectric films. Another dielectric cap layer 110 including the same or similar dielectric materials as the dielectric cap layer 106 is formed on the dielectric layer 108.

A bottom contact structure for a memory device, such as an MRAM or other non-volatile memory device, is formed in the dielectric layer 108 and includes a bottom contact layer 116 on a liner/barrier layer 118 (hereinafter "liner layer 118"). The liner layer 118 includes, for example, titanium nitride, tantalum nitride or tungsten nitride and is conformally formed on sidewalls and bottom surfaces of a trench in which the bottom contact 116 is formed. The bottom contact layer 116 includes, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides or combinations thereof deposited on the liner layer 118 using deposition techniques, including, but not necessarily limited to, physical vapor deposition (PVD), chemical vapor deposition (CVD), atomic layer deposition (ALD) or sputtering. In accordance with an embodiment of the present invention, the bottom contact 116 can be electrically connected to or form part of a contact line, such as, for example, a wordline, of a resulting memory cell array. For ease of explanation, one bottom contact structure and one interconnect 104 ultimately corresponding to one memory device is shown in the figures. It is to be understood that this is merely illustrative, and the embodiments of the present invention are not necessarily limited to the number of contacts, interconnects or memory devices shown, and the embodiments of the present invention can apply to the formation of multiple contacts, interconnects and/or memory devices, as well as the formation of memory device regions along with non-memory device regions.

Referring further to FIG. 1, a barrier layer 119 comprising the same or similar material as the liner layer 118 is embedded in the dielectric cap layer 110 on a top surface of the contact structure including the bottom contact and liner layers 116 and 118. As shown in FIG. 1, memory device layers 112 (also referred to herein as "memory element layers") are formed on the dielectric cap layer 110 including the barrier layer 119 therein. For example, in the case of an MRAM, the memory device layers 112 include a magnetic tunnel junction (MTJ) structure comprising, for example, one or more magnetic fixed layers, non-magnetic barrier layers, free layers and oxide layers. The memory device layers 112 are not limited to those for an MRAM, and can include layers for memory elements of, for example, PCRAM, RRAM or other non-volatile memory devices. A memory device cap layer 114, for example, an MTJ cap layer, is formed on the memory device layers 112. According to an embodiment of the present invention, the cap layer 114 includes, for example, niobium (Nb), niobium nitride (NbN), tungsten (W), tungsten nitride (WN), tantalum (Ta), tantalum nitride (TaN), titanium (Ti), titanium nitride (TiN), ruthenium (Ru), molybdenum (Mo), chromium (Cr), vanadium (V), palladium (Pd), platinum (Pt), rhodium (Rh), scandium (Sc) and/or other conductive materials.

Following formation of the cap layer 114, a plurality of first hardmask layers 120-1, 120-2, 120-3, and 120-4 (collectively "layers 120") are alternatingly stacked with a plurality of second hardmask layers 125-1, 125-2, 125-3 and 125-4 (collectively "layers 125"). Each pair of alternatingly stacked hardmask layers (e.g., 120-1 and 125-1, 120-2 and 125-2, 120-3 and 125-3, 120-4 and 125-4) includes oppositely stressed layers. For example, in accordance with an embodiment of the present invention, a first hardmask layer of each pair has tensile stress and a second hardmask layer of each pair has compressive stress, or vice versa, so that the collective stress of the first and second hardmask layers is canceled, substantially canceled or at least reduced to a desired amount due to the opposing stress states. Collectively in the entire hardmask structure, due to the opposing stresses in each alternating layer of the stack of layers 120 and 125, stress in the overall hardmask structure is eliminated, substantially eliminated or at least reduced to a desired amount, thereby reducing or preventing film stress and wafer bowing. While the alternating layers 120 and 125 have opposite stress states from each other, the magnitudes of the opposing stresses are not necessarily equal to each other. However, the magnitudes are not precluded from being equal to each other.

Although 4 of each of the first and second hardmask layers 120-1 to 120-4 and 125-1 to 125-4 are shown, the embodiments of the present invention are not necessarily limited to the illustrated number of hardmask layers, and there may be more or less than 4 of each layer. For example, there may be 3 or 5 of each of the first and second hardmask layers 120-1 to 120-4 and 125-1 to 125-4. In accordance with an embodiment of the present invention, there is at least one first hardmask layer 120 and at least one second hardmask layer 125. In addition, although there may be the same number of layers 120 and 125, because the magnitude of stress contribution from each layer may be different, there does not necessarily need to be the same number of layers 120 as the layers 125.

The layers 120 and 125 can each include, for example, an electrically conductive material capable of being patterned to form smooth pillars such as, but not necessarily limited to, Nb, NbN, W, WN, Ta, TaN, Ti, TiN, Ru, Mo, Cr, V, Pd, Pt, Rh, Sc, aluminum (Al) and/or silicides thereof, and can each be deposited using deposition techniques including, but not necessarily limited to PVD, CVD, ionized PVD (I-PVD), ALD, plasma-enhanced CVD (PECVD), electroplating and/or electroless plating.

The layers 120 and 125 can have the same thickness as or different thicknesses from each other, and may be formed of the same material as or different materials from each other, as long as the layers have the opposite stress states and reduce overall stress and wafer bow, thereby improving alignment issues. Stress in layers 120 and 125 can be controlled using different techniques. For example, levels of nitrogen in layers 120 and 125 formed of nitrides can affect stress states, so that one set of the layers (e.g., layers 120) may have a higher percentage of nitrogen than another set of layers (e.g., layers 125) or vice versa, or an individual layer may have a higher nitrogen percentage than another layer. For example, a layer or set of layers which is more nitrogen-rich relative to another layer or set of layers may have a higher intrinsic stress than the less nitrogen-rich layer(s) due to more disrupted crystallization. In order to increase the nitrogen levels in the layers 120 or 125, nitrogen can be, for example bled in to the chosen layers 120 or 125 during the metal deposition process.

In another example, if a material of a first set of the layers 120 or 125 is a higher stress film than the material of a second set of alternating layers with the opposite stress states, the alternating layers may be thicker than the higher stress film layers in order to compensate for the stress of the material of the first set of the layers.

Figure 2:
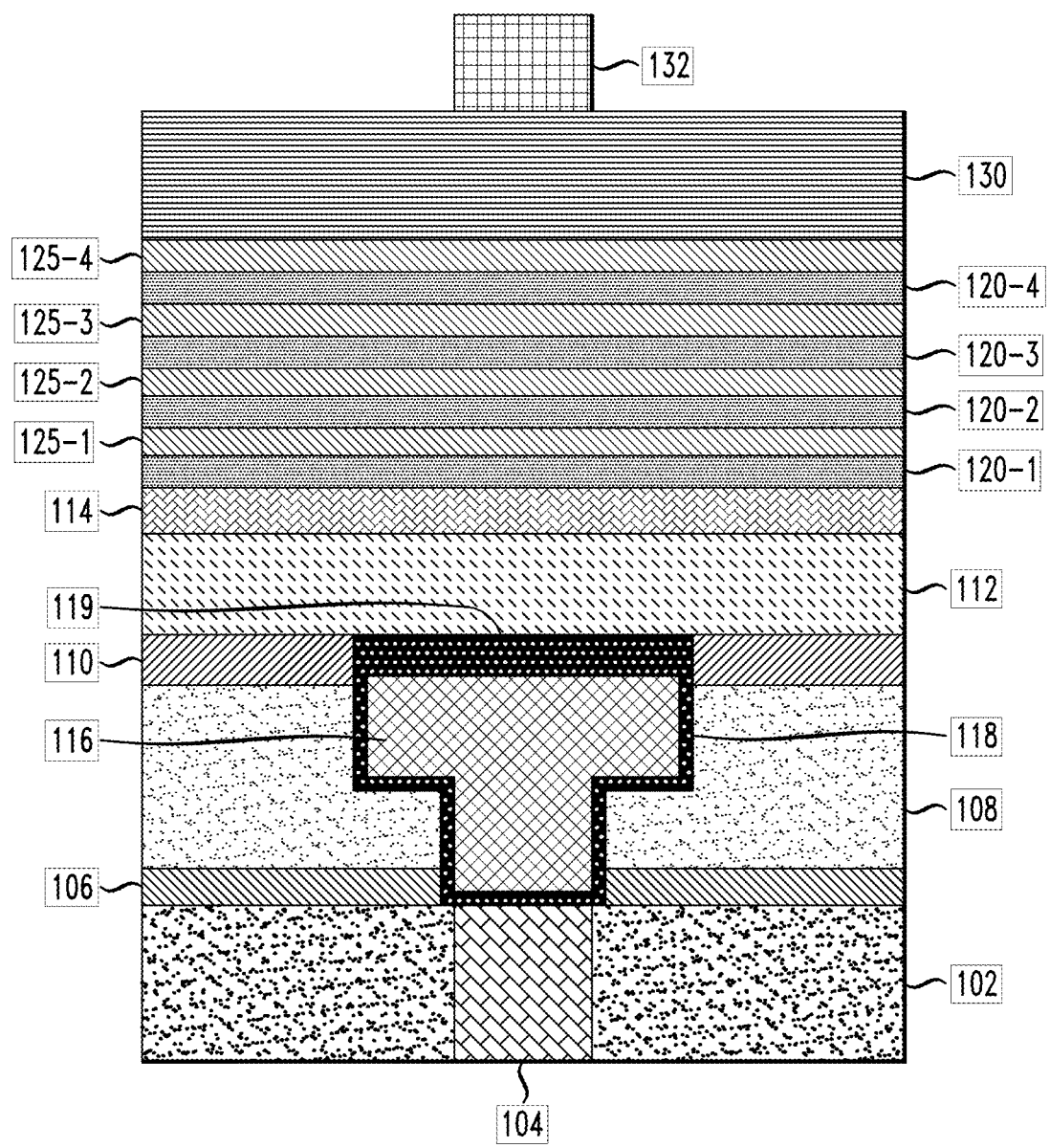
FIG. 2 is a schematic cross-sectional view illustrating manufacturing of a semiconductor device and showing deposition of a dielectric layer and resist formation, according to an embodiment of the invention.

FIG. 2 is a schematic cross-sectional view illustrating manufacturing of a semiconductor device and showing deposition of a dielectric layer and resist formation, according to an embodiment of the invention. Referring to FIG. 2, a dielectric layer 130 is formed on the uppermost layer 125-4 of the multilayer hardmask structure including layers 120 and 125. The dielectric layer 130 includes the same or similar dielectric materials as the dielectric layer 102 such as, for example, TEOS, $SiO_2$, SiCOH, SiLK® dielectrics, and/or porous forms of these low-k dielectric films, and is deposited using a deposition technique, such as, but not necessarily limited to, PVD, CVD, ALD or sputtering.

Using lithography techniques, a resist 132 is formed on the dielectric layer 130 to cover a portion of the multilayer hardmask structure over the bottom contact structure that is to be patterned using one or more etching techniques as described in connection with FIG. 3.

Figure 3:
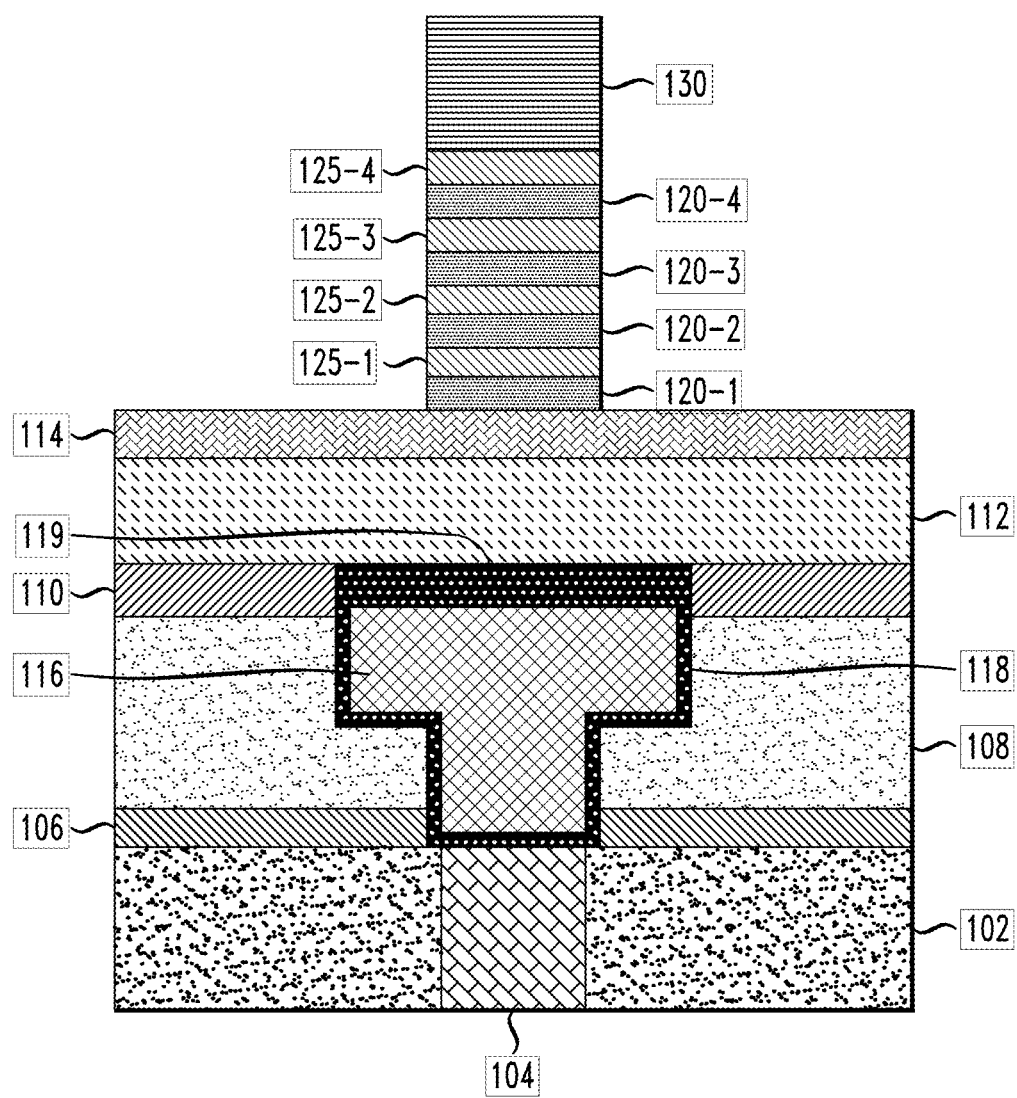
FIG. 3 is a schematic cross-sectional view illustrating manufacturing of a semiconductor device and showing patterning of the multi-layer hardmask, according to an embodiment of the invention.

FIG. 3 is a schematic cross-sectional view illustrating manufacturing of a semiconductor device and showing patterning of the multi-layer hardmask, according to an embodiment of the invention. Referring to FIG. 3, using the resist 132 as a mask, a dielectric etch process is performed to remove exposed portions of the dielectric layer 130. Following removal of the exposed portions of the dielectric layer 130, the resist 132 is removed and, using the remaining patterned dielectric layer 130 as a mask, a hard mask open (HMO) etch is performed on the exposed portions of the layers 120 and 125 down to the cap layer 114. According to an embodiment of the present invention, depending on etch selectivity of the layers 120 and 125 with respect to each other, the HMO etch can be done either with the same chemistry to remove both sets of layers 120 and 125, or cycled between processes tailored to each respective material of layers 120 and 125. In a non-limiting example, a fluorine-based etch can be used for removal of exposed portions of layers 120, and a chlorine-based etch can be used for removal of exposed portions of layers 125. According to an embodiment an ion-beam etch (IBE) could be used to cyclically pattern layers known to be difficult to perform reactive ion etching (RIE) etch through.

Figure 4:
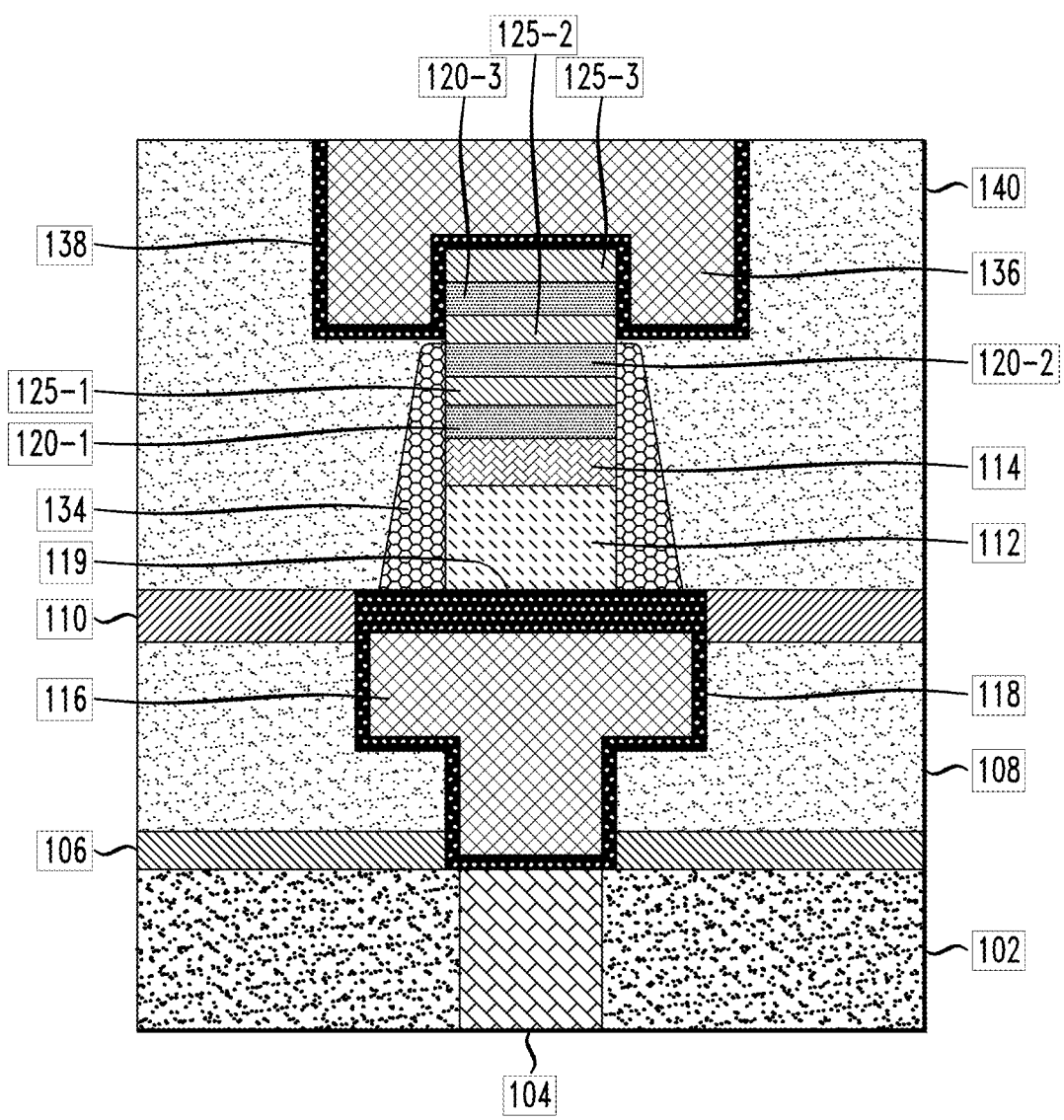
FIG. 4 is a schematic cross-sectional view illustrating a memory device including a multi-layer hardmask having alternating layers with different stress states, according to an embodiment of the invention.

FIG. 4 is a schematic cross-sectional view illustrating a memory device including a multi-layer hardmask having alternating layers with different stress states, according to an embodiment of the invention. Referring to FIG. 4, additional processing is performed to remove exposed portions of the cap layer 114 and the memory device layers 112 not under the patterned layers 120 and 125. Further, encapsulation layers 134 are added on the dielectric cap layer 110 and on the sides of the patterned memory device layers 114 and hardmask layers 120 and 125. A top contact structure including a contact layer 136 formed on a liner/barrier layer 138 (hereinafter "liner layer 138") is formed on and around the hardmask layers 120 and 125, and a dielectric fill layer 140 is formed on exposed portions of the dielectric cap layer 110 and on sides of the encapsulation layer 134 and top contact structure.

The exposed portions of the cap layer 114 and the memory device layers 112 are removed using one or more etching processes, including, but not necessarily limited to, IBE and/or methanol based ME. Following the removal, encapsulation layers 134 comprising, for example, silicon nitride (SiN), silicon carbon nitride (SiCN), silicon nitrided oxide (SiNO), NBLoK™, or other dielectric barrier materials, are deposited and patterned to be formed on the barrier layer 119 adjacent a lower portion of the patterned hardmask layers 120 and 125 and the patterned cap and memory device layers 112 and 114.

After removal of the dielectric layer 130, a dielectric fill layer 140 comprising, for example, the same or similar dielectric materials as the dielectric layer 102 such as TEOS, $SiO_2$, SiCOH, SiLK® dielectrics, and/or porous forms of these low-k dielectric films, is deposited on the conductive hardmask structure including the patterned layers 120 and 125, and on the encapsulation and dielectric cap layers 134 and 110 using a deposition technique, such as, but not necessarily limited to, PVD, CVD, ALD or sputtering.

A trench is formed in the dielectric fill layer 140 in an area over a top surface of the uppermost layer 125-3 and extending downward along sides (e.g., left and right sides) of the hardmask structure. The trench is lined with the liner layer 138, which contacts the sides and the top surface of the multilayer hardmask structure exposed by trench formation. A contact layer 136 deposited on the barrier layer 138 fills in a remaining portion of the trench as shown in FIG. 4. In the illustrated embodiment, the uppermost layer of the multi-layer hardmask structure is layer 125-3. This is due the original upper layers of the hardmask structure (e.g., 120-4 and 125-4) being removed during patterning (e.g., IBE) of the exposed portions of the cap layer 114 and the memory device layers 112. In some embodiments, the patterning of the exposed portions of the cap layer 114 and the memory device layers 112 may not remove upper portions of the hardmask structure, may reduce a thickness of an uppermost layer, or may remove more or less than the two layers shown in this embodiment.

The liner layer 138 includes, for example, titanium nitride, tantalum nitride or tungsten nitride and is conformally formed on sidewalls and bottom surfaces of the trench in which the top contact layer 136 is formed. The contact layer 136 includes, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides or combinations thereof deposited on the liner layer 138 using deposition techniques, including, but not necessarily limited to, PVD, CVD, ALD or sputtering. In accordance with an embodiment of the present invention, the top contact layer 136 can be electrically connected to or form part of a contact line, such as, for example, a bitline, of a resulting memory cell array. For ease of explanation, one top contact structure corresponding to one memory device is shown in the figures. It is to be understood that this is merely illustrative, and the embodiments of the present invention are not necessarily limited to the number of contacts, interconnects or memory devices shown, and the embodiments of the present invention can apply to the formation of multiple contacts, interconnects and/or memory devices, as well as the formation of memory device regions along with non-memory device regions. According to an embodiment of the present invention, following deposition of the top contact structure, a planarization process, such as, for example, chemical mechanical polishing (CMP) can be performed to planarize an upper surface of the device 100.

Figure 5:
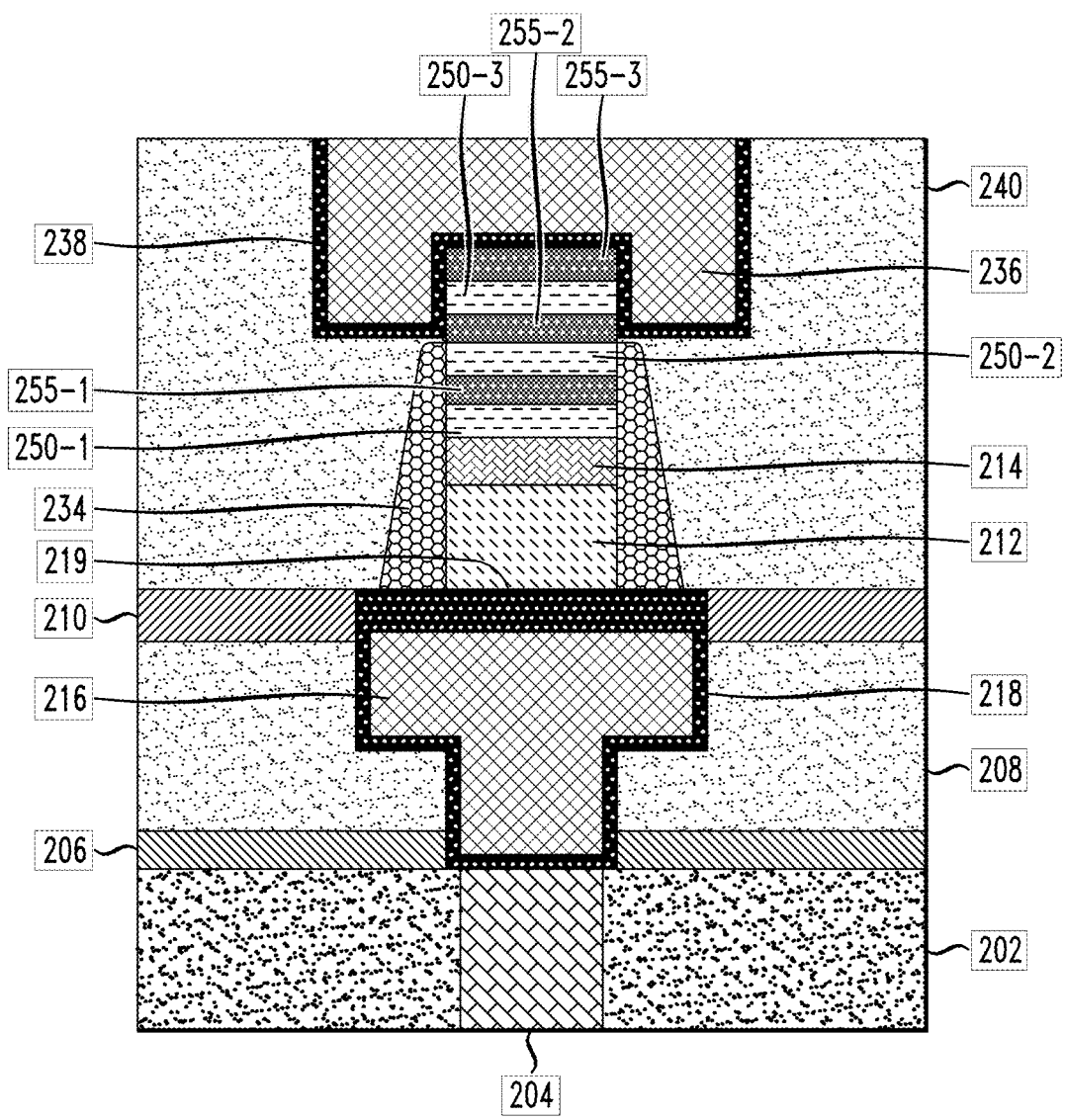
FIG. 5 is a schematic cross-sectional view illustrating a memory device including a multi-layer hardmask having alternating large/columnar grain layers with buffer layers, according to an embodiment of the invention.

FIG. 5 is a schematic cross-sectional view illustrating a memory device including a multi-layer hardmask having alternating large/columnar grain layers with buffer layers, according to an embodiment of the invention. Referring to FIG. 5, a memory device 200 having a similar configuration and formed by similar processing to the memory device 100 described in connection with FIGS. 1-4 is shown. The same or similar elements in FIG. 5 as in FIG. 4 have been marked with similar reference numbers and duplicative descriptions have been omitted. In general, dielectric layers 202, 208 and 240, dielectric cap layers 206 and 210, interconnect 204, bottom contact, liner and barrier layers 216, 218, 219, memory element and memory cap layers 212 and 214, encapsulation layers 234, and top contact and liner layers 236 and 238 of device 200, are the same or similar to dielectric layers 102, 108 and 140, dielectric cap layers 106 and 110, interconnect 104, bottom contact, liner and barrier layers 116, 118, 119, memory element and memory cap layers 112 and 114, encapsulation layers 134, and top contact and liner layers 136 and 138 of device 100.

Although deposited and patterned in a similar manner to the multi-layer conductive hardmask structure of the device 100 using, for example, PVD, CVD, I-PVD, ALD, PECVD, electroplating and/or electroless plating deposition techniques, and lithography and HMO etching techniques, as described herein in connection with FIGS. 1, 2 and 3, the device 200 has a different multi-layer conductive hardmask structure than that of the device 100. For example, a plurality of first hardmask layers 250-1, 250-2 and 250-3 (collectively "layers 250") are alternatingly stacked with a plurality of second hardmask layers 255-1, 255-2 and 255-3 (collectively "layers 255"). Each pair of alternatingly stacked hardmask layers (e.g., 250-1 and 255-1, 250-2 and 255-2, 250-3 and 255-3) includes a large/columnar grain layer and buffer layer. For example, in accordance with an embodiment of the present invention, a first hardmask layer 250 of each pair is a large/columnar layer and a second hardmask layer 255 of each pair is a buffer layer, so that propagation of a crystal structure is broken up (e.g., prevented) along the entire thickness (e.g., vertical height) of the multi-layer conductive hardmask structure. More specifically, large/columnar grain layers 250 are alternated with buffer layers 255 to break up crystallinity, wherein the buffer layers 255 block crystal structures of underlying large/columnar grain layers 250 from extending upward in a thickness direction of the multi-layer conductive hardmask structure. According to an embodiment, "large/columnar grain", "large grain" or "columnar grain" refers to a width of the grain (e.g., crystal grain) being equal to or greater than a thickness of the layer.

Although 3 of each of the first and second hardmask layers 250-1 to 250-3 and 255-1 to 255-3 are shown, the embodiments of the present invention are not necessarily limited to the illustrated number of hardmask layers, and there may be more or less than 3 of each layer. In accordance with an embodiment of the present invention, there is at least one first hardmask layer 250 and at least one second hardmask layer 255. In addition, although there may be the same number of layers 250 and 255, there does not necessarily need to be the same number of layers 250 as the layers 255.

The layers 250 and 255 can each include, for example, a conductive material such as, but not necessarily limited to, Nb, NbN, W, WN, Ta, TaN, Ti, TiN, Ru, Mo, Cr, V, Pd, Pt, Rh, Sc, Al and/or silicides thereof, and can each be deposited using deposition techniques including, but not necessarily limited to PVD, CVD, I-PVD, ALD, PECVD, electroplating and/or electroless plating. According to an embodiment, the layers 250 can be any desired conductive material that forms large/columnar grains, and the layers 255 can be any conductive material that will prevent the propagation of grain structure through the thickness of the hardmask structure (i.e., in the vertical direction in the drawings). For example, the large/columnar layers 250 may be a pure metal (e.g. TaN) and the buffer layers 255 may be the metal nitride (e.g., TaN) or metal oxide (e.g., $Ta_xO_y$) versions of the pure metal layers 250. In general the combination of the layers 250 and 255 for the hardmask structure results in reduced wafer bowing and improved hardmask grain structure and circularity/pattern transfer fidelity for the device 200.

The layers 250 and 255 can have the same thickness as or different thicknesses from each other. In one non-limiting example, the buffer layers 255 are thinner than the large/columnar grain layers 250, whereby the buffer layers have a thickness of about 1 nm to about 5 nm and the large/columnar grain layers 250 have a thickness of about 10 nm to about 30 nm.

Figure 6:
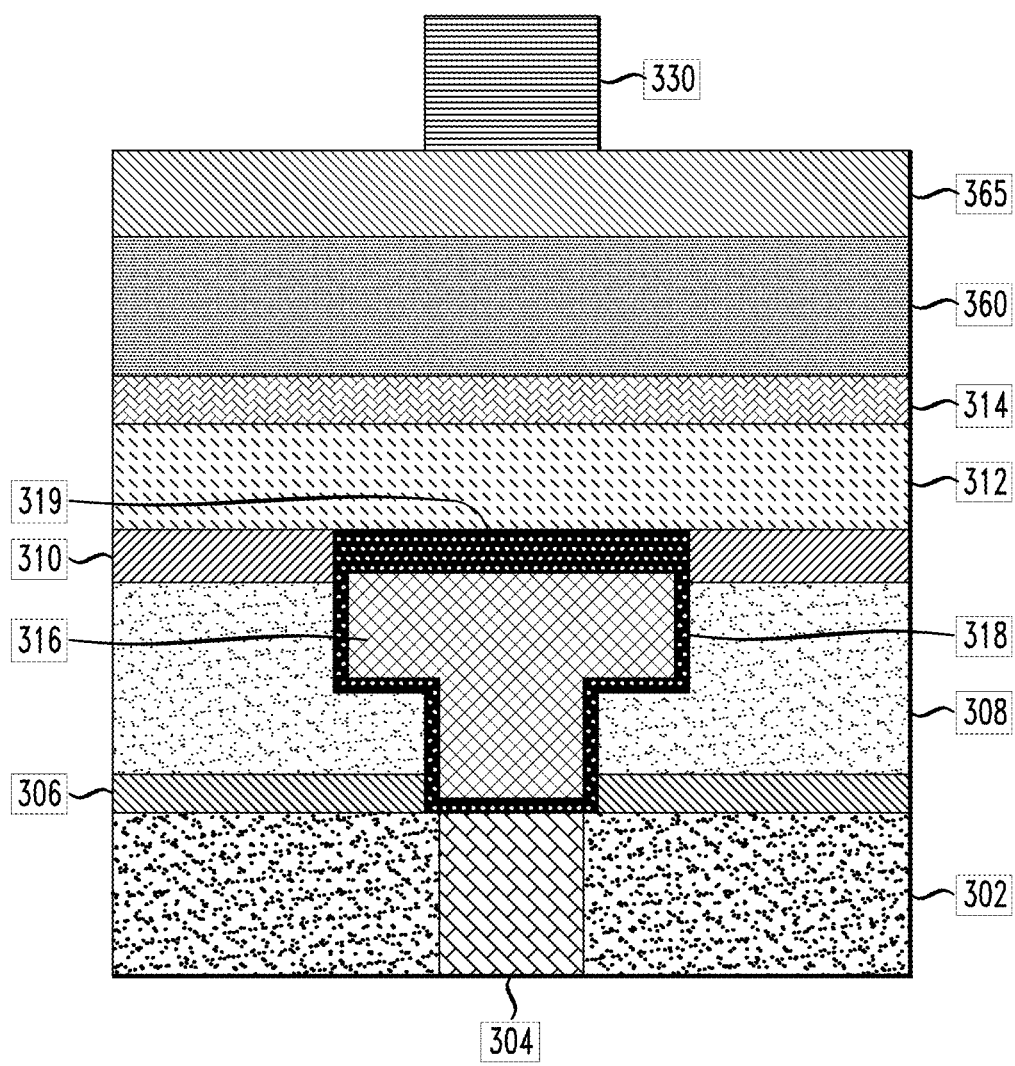
FIG. 6 is a schematic cross-sectional view illustrating manufacturing of a semiconductor device and showing patterning of a dielectric layer, according to an embodiment of the invention.

FIG. 6 is a schematic cross-sectional view illustrating manufacturing of a semiconductor device and showing patterning of a dielectric layer, according to an embodiment of the invention. Referring to FIG. 6, a memory device 300 having a similar configuration and formed by similar processing to the memory devices 100 and 200 described in connection with FIGS. 1-5 is shown. The same or similar elements in FIG. 6 as in FIGS. 1-5 have been marked with similar reference numbers and duplicative descriptions have been omitted. In general, dielectric layers 302, 308 and 330, dielectric cap layers 306 and 310, interconnect 304, bottom contact, liner and barrier layers 316, 318, 319, and memory element and memory cap layers 312 and 314 of device 200, are the same or similar to dielectric layers 102/202, 108/208 and 130, dielectric cap layers 106/206 and 110/210, interconnect 104/204, bottom contact, liner and barrier layers 116/216, 118/218, 119/219, and memory element and memory cap layers 112/212 and 114/214 of devices 100 and 200.

Following formation of the cap layer 314, a first hardmask layer 360 is formed on the cap layer 314, and a second hardmask layer 365 is formed on the first hardmask layer 360. The second hardmask layer 365 is a relatively thin, high stress top layer formed on the lower first hardmask layer 360. The second (e.g., top) hardmask layer 365 functions to reduce wafer bow and/or improve sidewall roughness to improve uniformity, and is completely or partially removed during patterning steps.

The hardmask layers 360 and 365 are oppositely stressed from each other. For example, in accordance with an embodiment of the present invention, the first hardmask layer 360 has tensile stress and the second hardmask layer 365 has compressive stress, or vice versa, so that the collective stress of the first and second hardmask layers 360, 365 is canceled, substantially canceled or at least reduced to a desired amount due to the opposing stress states, thereby reducing or preventing wafer bowing, and improving sidewall roughness. While the alternating layers 360 and 365 have opposite stress states from each other, the magnitudes of the opposing stresses are not necessarily equal to each other. However, the magnitudes are not precluded from being equal to each other.

The layer 360 includes, for example, a conductive material any desired conductive material that will remain after pillar etch such as, but not necessarily limited to, Nb, NbN, W, WN, Ta, TaN, Ti, TiN, Ru, Mo, Cr, V, Pd, Pt, Rh, Sc, Al and/or silicides thereof, and can be deposited using deposition techniques including, but not necessarily limited to PVD, CVD, ionized PVD, I-PVD, ALD, PECVD, electroplating and/or electroless plating.

The layer 365 includes, for example, any high stress conductive material that will decrease total wafer bow by having an opposite stress of the material of layer 360. If remaining in the hardmask structure of the final device 300, the layer 365 is conductive and can be formed of, for example, Nb, NbN, W, WN, Ta, TaN, Ti, TiN, Ru, Mo, Cr, V, Pd, Pt, Rh, Sc, Al and/or silicides thereof. Alternatively, the layer 365 may be sacrificial and not remain in the final hardmask structure; in which case, the layer 365 could be non-conductive, but have a higher etch resistance than the dielectric layer 330 (i.e., the dielectric layer 330 can be selectively etched with respect to the second hardmask layer 365). In accordance with an embodiment of the present invention, a sacrificial hardmask layer 365 may be completely removed during a subsequent IBE process when patterning the hardmask structure into a pillar on the memory device layers 312. Examples of materials when the hardmask layer 365 is a sacrificial layer include, but are not necessarily limited to, aluminum nitride, and high-K dielectrics such as, for example, $HfO_2$ (hafnium oxide), $ZrO_2$ (zirconium dioxide), hafnium zirconium oxide, and $Al_2O_3$ (aluminum oxide). The second hardmask layer 365 can be deposited using deposition techniques including, but not necessarily limited to PVD, CVD, ionized PVD, I-PVD, ALD, PECVD, electroplating and/or electroless plating.

In accordance with an embodiment of the present invention, the layer 365 is thinner than the layer 360. For example, a thickness range for the layer 360 is about 10 nm-about 150 nm, and a thickness range for the layer 365 is about 5 nm-about 50 nm. The layers 360 and 365 may be formed of the same material as or different materials from each other, as long as the layers have the opposite stress states and reduce wafer bow and/or improve sidewall roughness. In an example embodiment, the layer 365 may have a finer grain structure and/or a lower etch rate than the layer 360, which improves circular edge roughness and pattern fidelity transfer into the material of layer 360.

Stress in layers 360 and 365 can be controlled using different techniques. For example, levels of nitrogen in layers 360 and 365 formed of nitrides can affect stress states, so that one layer may have a higher percentage of nitrogen than the other layer or vice versa. As noted above, in order to increase the nitrogen levels in the layers 360 or 365, nitrogen can be, for example bled in to the chosen layer 360 or 365 during the metal deposition process.

Similar to the processing described in connection with FIG. 2, a dielectric layer is formed on the second hardmask layer 365, includes the same or similar dielectric materials as the dielectric layer 102, and is deposited using a deposition technique, such as, but not necessarily limited to, PVD, CVD, ALD or sputtering. Using lithography techniques, a resist is formed on the dielectric layer to cover a portion of the hardmask structure over the bottom contact structure. As described in connection with FIG. 7, the hardmask structure including layers 360 and 365 is patterned using one or more etching techniques. Using the resist as a mask, a dielectric etch process is performed to remove exposed portions of the dielectric layer to result in the patterned dielectric layer 330 shown in FIG. 6 Following removal of the exposed portions of the dielectric layer, the resist is removed.

Figure 7:
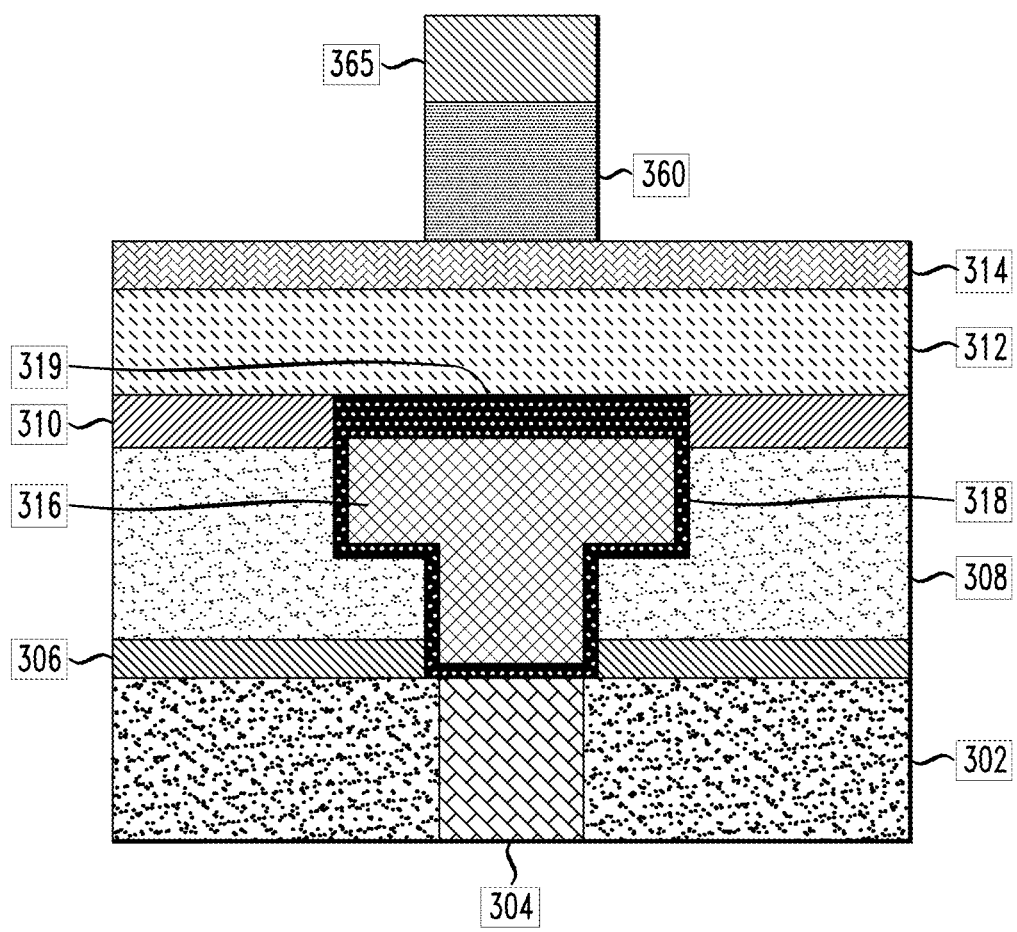
FIG. 7 is a schematic cross-sectional view illustrating manufacturing of a semiconductor device and showing patterning of the multi-layer hardmask, according to an embodiment of the invention.

FIG. 7 is a schematic cross-sectional view illustrating manufacturing of a semiconductor device and showing patterning of the multi-layer hardmask, according to an embodiment of the invention. Referring to FIG. 7, using the remaining patterned dielectric layer 330 as a mask, a HMO etch is performed on the exposed portions of the layers 360 and 365 down to the cap layer 314. According to an embodiment of the present invention, depending on etch selectivity of the layers 360 and 365 with respect to each other, the HMO etch can be done either with the same chemistry to remove both layers 360 and 365, or with different processes tailored to each respective material of layers 360 and 365. According to an embodiment an IBE could be used to cyclically pattern the layers 360 and 365 and/or fully remove layer 365.

Figure 8:
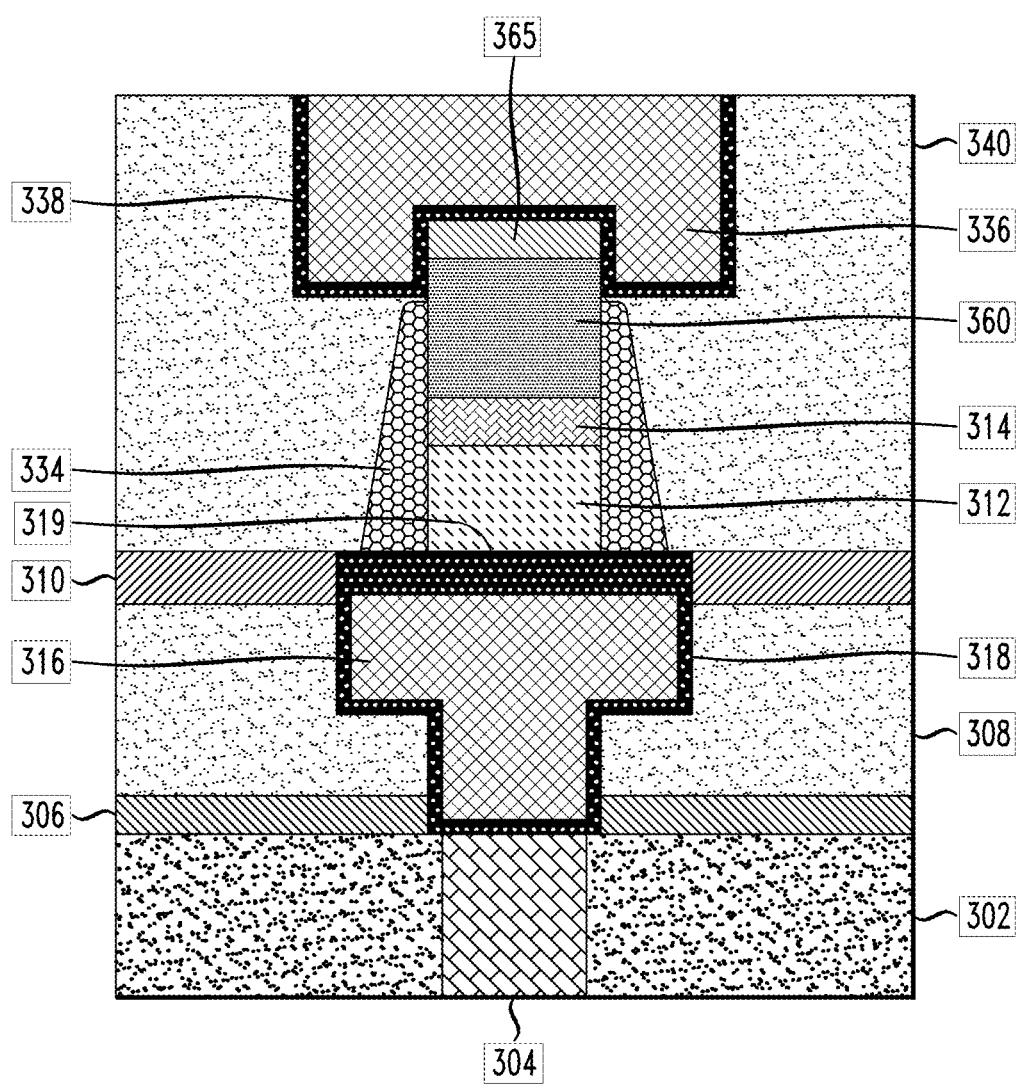
FIG. 8 is a schematic cross-sectional view illustrating a memory device including a multi-layer hardmask having a top layer including a material to reduce wafer bow, according to an embodiment of the invention.

FIG. 8 is a schematic cross-sectional view illustrating a memory device including a multi-layer hardmask having a top layer including a material to reduce wafer bow, according to an embodiment of the invention. Referring to FIG. 8, additional processing is performed to remove exposed portions of the cap layer 314 and the memory device layers 312 not under the patterned layers 360 and 365. Further, encapsulation layers 334 are added on the dielectric cap layer 310 and on the sides of the patterned memory device layers 314 and hardmask layer 360. A top contact structure including a contact layer 336 formed on a liner/barrier layer 338 (hereinafter "liner layer 338") is formed on and around the hardmask layers 360 and 365, and a dielectric fill layer 340 is formed on exposed portions of the dielectric cap layer 310 and on sides of the encapsulation layer 334 and top contact structure.

Referring to FIG. 8, the elements 312, 314, 334, 336, 338 and 340 in memory device 300 have a similar configuration and are formed by similar processing to elements 112/212, 114/214, 134/234, 136/236, 138/238 and 140/240 of the memory devices 100/200 described in connection with FIGS. 1-5, and duplicative descriptions have been omitted.

FIG. 9 is a schematic cross-sectional view illustrating a memory device including a multi-layer hardmask having alternating buffer layers with large/columnar grain layers having rough top surfaces, according to an embodiment of the invention. Referring to FIG. 9, a memory device 400 having a similar configuration and formed by similar processing to the memory devices 100, 200 and 300 described in connection with FIGS. 1-8 is shown. The same or similar elements in FIG. 9 as in FIGS. 1-8 have been marked with similar reference numbers and duplicative descriptions have been omitted. In general, dielectric layers 402, 408 and 440, dielectric cap layers 406 and 410, interconnect 404, bottom contact, liner and barrier layers 416, 418, 419, memory element and memory cap layers 412 and 414, encapsulation layers 434, and top contact and liner layers 436 and 438 of device 400, are the same or similar to dielectric layers 102/202/302, 108/208/308 and 140/240/340, dielectric cap layers 106/206/306 and 110/210/310, interconnect 104/204/304, bottom contact, liner and barrier layers 116/216/316, 118/218/318, 119/219/319, memory element and memory cap layers 112/212/312 and 114/214/314, encapsulation layers 134/234/334, and top contact and liner layers 136/236/336 and 138/238/338 of devices 100, 200 and 300.

Although deposited and patterned in a similar manner to the multi-layer conductive hardmask structure of the devices 100 and 200 using, for example, PVD, CVD, I-PVD, ALD, PECVD, electroplating and/or electroless plating deposition techniques, and lithography and HMO etching techniques, as described herein in connection with FIGS. 1-5, the device 400 has a different multi-layer conductive hardmask structure than that of the devices 100 and 200. For example, a plurality of first hardmask layers 470-1, 470-2 and 470-3 (collectively "layers 470") are alternatingly stacked with a plurality of second hardmask layers 475-1, 475-2 and 475-3 (collectively "layers 475"). Like the device 200, each pair of alternatingly stacked hardmask layers (e.g., 470-1 and 475-1, 470-2 and 475-2, 470-3 and 475-3) includes a large/columnar grain layer and buffer layer. For example, in accordance with an embodiment of the present invention, a first hardmask layer 470 of each pair is a large/columnar layer and a second hardmask layer 475 of each pair is a buffer layer, so that propagation of a crystal structure is broken up (e.g., prevented) along the entire thickness (e.g., vertical height) of the multi-layer conductive hardmask structure. More specifically, large/columnar grain layers 470 are alternated with buffer layers 475 to break up crystallinity. In contrast to the device 200, in device 400, the large/columnar grain layers 470 have rough top surfaces as shown in FIG. 9, and the buffer layers 475 reduce the roughness by filling in gaps at the top surfaces of the large/columnar grain layers 470. As can be seen in FIG. 9, the rough top surfaces of the layers 470 are not planar, and include a jagged profile with varying height along a width of the layer. The jagged profile includes a plurality of relatively higher points (e.g., peaks) and a plurality of relatively lower points (e.g., valleys) along the top surface of each layer 470. The buffer layers 475, which are deposited on the large/columnar grain layers 470 fill in the gaps caused by the plurality of relatively lower points (e.g., valleys) along the top surface of each layer 470.

The roughness of the layers 470 can depend on the materials used and the deposition process, some materials and some deposition processes producing rougher top surfaces than other materials and deposition processes. For example, depending on plasma density, nitrogen content and/or other factors, high melting point metals or metal nitrides may produce a rough structure.

Although 3 of each of the first and second hardmask layers 470-1 to 470-3 and 475-1 to 475-3 are shown, the embodiments of the present invention are not necessarily limited to the illustrated number of hardmask layers, and there may be more or less than 3 of each layer. In accordance with an embodiment of the present invention, there is at least one first hardmask layer 470 and at least one second hardmask layer 475. In addition, although there may be the same number of layers 470 and 475, there does not necessarily need to be the same number of layers 470 as the layers 475.

The layers 470 and 475 can each include, for example, a conductive material such as, but not necessarily limited to, Nb, NbN, W, WN, Ta, TaN, Ti, TiN, Ru, Mo, Cr, V, Pd, Pt, Rh, Sc, Al and/or silicides thereof, and can each be deposited using deposition techniques including, but not necessarily limited to PVD, CVD, I-PVD, ALD, PECVD, electroplating and/or electroless plating. According to an embodiment, the layers 470 can be any desired conductive material that forms large/columnar grains and a rough top surface, and the layers 475 can be any conductive material that will prevent the propagation of grain structure through the thickness of the hardmask structure (i.e., in the vertical direction in the drawings), and fill in the gaps of the rough top surfaces of the layers 470. For example, the large/columnar layers 470 may be a pure metal (e.g. TaN) and the buffer layers 475 may be the metal nitride (e.g., TaN) or metal oxide (e.g., $Ta_xO_y$) versions of the pure metal layers 470. In general the combination of the layers 470 and 475 for the hardmask structure results in reduced wafer bowing and improved hardmask grain structure and circularity/pattern transfer fidelity for the device 400.

The layers 470 and 475 can have the same thickness as or different thicknesses from each other. In one non-limiting example, the buffer layers 475 are thinner than the large/columnar grain layers 470, whereby the buffer layers have a thickness of about 1 nm to about 5 nm and the large/columnar grain layers 470 have a thickness of about 10 nm to about 30 nm.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A method for manufacturing a semiconductor device, comprising:
    forming one or more memory device layers over a contact structure;
    depositing a plurality of hardmask layers on the one or more memory device layers in a stacked configuration, wherein alternating hardmask layers of the stacked configuration are different from each other in at least one respect; and
    patterning the plurality of hardmask layers and the one or more memory device layers into a pillar over the contact structure;
    wherein the alternating hardmask layers of the stacked configuration comprise a buffer hardmask layer stacked on a large grain hardmask layer.

2. The method according to claim 1, wherein the buffer hardmask layer is thinner than the large grain hardmask layer.

3. The method according to claim 1, wherein the buffer hardmask layer blocks a crystal structure from the large grain hardmask layer from extending along a thickness direction of the stacked configuration.

4. The method according to claim 1, wherein the large grain hardmask layer comprises a rough top surface.

5. The method according to claim 4, wherein the buffer layer fills in a plurality of gaps along the rough top surface of the large grain hardmask layer.

6. The method according to claim 1, wherein the plurality of hardmask layers are electrically conductive.

7. The method according to claim 1, wherein the plurality of hardmask layers comprise at least one of niobium (Nb), niobium nitride (NbN), tungsten (W), tungsten nitride (WN), tantalum (Ta), tantalum nitride (TaN), titanium (Ti), titanium nitride (TiN), ruthenium (Ru), molybdenum (Mo), chromium (Cr), vanadium (V), palladium (Pd), platinum (Pt), rhodium (Rh), scandium (Sc), aluminum (Al) and silicides thereof.

8. The method according to claim 1, wherein the plurality of hardmask layers are deposited using at least one of physical vapor deposition (PVD), chemical vapor deposition (CVD), ionized PVD (I-PVD), atomic layer deposition (ALD), plasma-enhanced CVD (PECVD), electroplating and electroless plating.

9. The method according to claim 1, wherein the alternating hardmask layers of the stacked configuration comprise a layer of a metal and one of a layer of an oxide of the metal and a layer of a nitride of the metal stacked on the layer of metal.

10. The method according to claim 1, further comprising forming another contact structure on the patterned plurality of hardmask layers.

11. A method for manufacturing a semiconductor device, comprising:
    forming one or more memory device layers over a bottom contact structure;
    depositing a plurality of hardmask layers on the one or more memory device layers in a stacked configuration, wherein alternating hardmask layers of the stacked configuration comprise a buffer hardmask layer stacked on a large grain hardmask layer;
    patterning the plurality of hardmask layers and the one or more memory device layers into a pillar over the bottom contact structure; and
    forming a top contact structure on the patterned plurality of hardmask layers;
    wherein the buffer hardmask layer blocks a crystal structure from the large grain hardmask layer from extending along a thickness direction of the stacked configuration.

12. The method according to claim 11, wherein the large grain hardmask layer comprises a rough top surface.

* * * * *